(12) United States Patent
Oya et al.

(10) Patent No.: US 8,196,609 B2
(45) Date of Patent: Jun. 12, 2012

(54) INTEGRATED GAS PANEL APPARATUS

(75) Inventors: Kazuhiro Oya, Kyoto (JP); Tatsuya Hayashi, Kyoto (JP)

(73) Assignee: HORIBA STEC, Co., Ltd., Kyoto-shi (JP)

( * ) Notice: Subject to any disclaimer, the term of this patent is extended or adjusted under 35 U.S.C. 154(b) by 675 days.

(21) Appl. No.: 12/438,348

(22) PCT Filed: Aug. 21, 2007

(86) PCT No.: PCT/JP2007/066211
§ 371 (c)(1),
(2), (4) Date: Feb. 20, 2009

(87) PCT Pub. No.: WO2008/023711
PCT Pub. Date: Feb. 28, 2008

(65) Prior Publication Data
US 2009/0320754 A1  Dec. 31, 2009

(30) Foreign Application Priority Data

Aug. 23, 2006 (JP) ................................. 2006-226874
Aug. 23, 2006 (JP) ................................. 2006-226970
Aug. 23, 2006 (JP) ................................. 2006-227224

(51) Int. Cl.
*F16K 11/10* (2006.01)
(52) U.S. Cl. ........................................................ 137/884
(58) Field of Classification Search .................. 137/269, 137/270, 597, 884
See application file for complete search history.

(56) References Cited

U.S. PATENT DOCUMENTS

| 5,605,179 | A  | * | 2/1997  | Strong et al. | 137/884 |
| 5,769,110 | A  | * | 6/1998  | Ohmi et al. | 137/269 |
| 5,836,355 | A  | * | 11/1998 | Markulec et al. | 137/884 |
| 6,068,016 | A  | * | 5/2000  | Manofsky et al. | 137/269 |
| 6,283,143 | B1 | * | 9/2001  | Adachi et al. | 137/341 |
| 6,648,020 | B2 | * | 11/2003 | Fujimoto et al. | 137/884 |

FOREIGN PATENT DOCUMENTS

| JP | 63009785 A | 1/1988 |
| JP | 63-96375 | 4/1988 |
| JP | 10-169881 | 6/1998 |
| WO | 98/41766 | 9/1998 |
| WO | 99/64772 | 12/1999 |
| WO | 0144720 A1 | 6/2001 |

OTHER PUBLICATIONS

ISA Japan; International Search Report of PCT/JP2007/066211; Nov. 20, 2007; WIPO.

* cited by examiner

*Primary Examiner* — John Fox
(74) *Attorney, Agent, or Firm* — Alleman Hall McCoy Russell & Tuttle LLP

(57) ABSTRACT

Provided is an integrated gas panel apparatus which has excellent responsiveness, stabilizes gas concentration, and furthermore, can keep a conventional panel shape as it is. A panel body comprises at least a main flow channel block body for forming a main flow channel, and a branch flow channel block body for forming a branch flow channel. The branch flow channel block bodies are arranged on the both right and left sides to face each other by having the main flow channel block body at the center.

7 Claims, 14 Drawing Sheets

INTEGRATED GAS PANEL APPARATUS

FIELD OF THE ART

This invention relates to an integrated gas panel apparatus used for a process of manufacturing semiconductors.

BACKGROUND ART

Integrated gas panel apparatus is to control and finally to mix flow of several different kinds of gas used for manufacturing semiconductor devices and to supply them to a chamber. The integrated gas panel apparatus has been developed in order to shorten a gas supply control line comprising a piping structure arranged on the downstream side of the chamber. More concretely, as one example is shown in the patent document 1, a gas control unit such as a valve or a mass flow controller is mounted on a panel body generally of a plate shape. Inside the panel body are formed, for example, multiple branch flow channels on which the above-mentioned gas control unit is mounted and a single main flow channel with which the branch flow channels are connected and into which each gas flowing in the branch flow channels joins.

Various improvements have been carried out to the integrated gas panel apparatus, there is an integrated gas panel apparatus having an arrangement of the panel bodies by appropriately connecting various kinds of block bodies so as to construct a flexible flow channel to cope with various kinds of gas to be used.

Patent document 1: Japan patent laid-open number 10-169881

DISCLOSURE OF THE INVENTION

Problems to be Solved by the Invention

However, for this kind of conventional apparatus, branch flow channels are arranged in parallel at one side of a main flow channel and portions where each of the branch flow channels joins the main flow channel are arranged generally at even intervals from an upstream to a downstream of the main flow channel in an order corresponding to an order of the branch flow channels.

However, with this arrangement, if, for example, the number of the branch flow channels becomes multiple, a length of the main flow channel becomes long for the number of the branch flow channels so that the time required for the gas to reach the final exit becomes long. Then an adverse effect is exerted on the responsiveness of the fluid circuit system. The adverse effect is especially remarkable for the gas from the branch flow channel located at an upper side of the main flow channel or for the gas of a small amount. As a result of this, it becomes difficult to fully handle a process that requires short time/high speed responsiveness. In addition, there will be a problem in that the gas concentration becomes unstable because of slow responsiveness.

Especially in a semiconductor manufacturing process, since shortening a process time of a high speed gas process in a manufacturing process (such as shortening an exhaust time until rising is stabilized/shortening a purge time at a time of completion) is an important factor, a problem because of deterioration of the responsiveness is not preferable.

In addition, for example, in a semiconductor manufacturing process, the finally supplied several kinds of gas are required to be sufficiently mixed. This is because if a mixed state of the supplied gas is uneven, the quality of a device will be deteriorated. On the contrary, conventionally a length of the pipe located on the downstream side of the integrated gas panel apparatus is elongated to promote mixing or a gas mixer is arranged on the downstream side of the integrated gas panel apparatus.

However, with this arrangement, although mixture of the gas can be conducted sufficiently, a pipe capacity increases so that an adverse effect is exerted on the responsiveness. As a result of this, it becomes difficult to fully cope with a process that requires short time/high speed responsiveness like the above mentioned example. In addition, if the responsiveness is retarded, an adverse effect is exerted on stabilizing the gas concentration at a time of rising. Furthermore, in case that an amount of a gas flow from a branch flow channel is small, the arrival time for the gas becomes longer so that the responsiveness gets worse, and an amount of the joined flow gas is easily fluctuated due to pressure fluctuation of the gas flowing from the main flow channel so that it might be a case that the gas concentration finally becomes unstable.

In addition, since this kind of conventional apparatus has an arrangement wherein the branch flow channels are arranged in parallel at one side of the main flow channel and portions where each of the branch flow channels and the main flow channel join are arranged generally at even intervals from an upstream to a downstream of the main flow channel in an order corresponding to an order of the branch flow channels, there is a problem in that the arrival time of the gas to the final exit varies depending on a location of a portion where the branch flow channel joins the main flow channel. In this case, since the arrival time of the gas flowing from the branch flow channel located at the most upstream side becomes the longest, this arrival time limits a rate of the responsiveness of the fluid circuit system.

Furthermore, since it is not possible to assure the synchronism of the gas arrival time from each branch flow channel, the gas concentration distribution tends to be unstable at a time of rising.

In addition, if the number of the branch flow channels becomes multiple, a length of the main flow channel becomes long by just the number of the branch flow channels so that an adverse effect is exerted on the responsiveness of the fluid circuit system.

In other words, with a conventional arrangement, it becomes difficult to fully cope with a process that requires short time/high speed responsiveness and there will be a problem in that the gas concentration becomes unstable.

The present claimed invention intends to solve all of these problems and a main object of this invention is to provide an integrated gas panel apparatus which has excellent responsiveness, stabilizes the gas concentration, and furthermore, can keep a conventional panel shape as it is without complicating or enlarging the structure, or even more enables downsizing.

Means to Solve the Problems

More specifically, integrated gas panel apparatus in accordance with claim 1 of the invention comprises multiple branch flow channels in a course of which a gas control unit such as a valve or a mass flow controller is arranged so as to control the gas that flows inside the branch flow channel, a single main flow channel into which the gas from each of the branch flow channels flows and joins, and a panel body of a manifold type inside of which the branch flow channels and the main flow channel are formed by assembling multiple block bodies, and is characterized by that the panel body comprises a main flow channel block body that forms the main flow channel, and branch flow channel block bodies that are arranged to face each other by having the main flow channel block body at the center and that forms the branch flow channels.

In accordance with this arrangement, since the branch flow channel that is conventionally arranged at only one side of the main flow channel is arranged at the right and left sides of the main flow channel, a length of the main flow channel can be shortened. As a result, the time required for the gas to reach the final exit can be shortened and the responsiveness can be improved. This also contributes to stabilization of the gas concentration. In addition, since the panel body is made to have the same shape as that of a conventional panel body by arranging the block bodies constituting each flow channel in a plane, it is possible to be easily replaced with a conventional panel body.

As the most preferable arrangement to shorten the length of the main flow channel represented is that a junction where one branch flow channel joins the main flow channel and another junction where the other branch flow channel that faces to the above-mentioned branch flow channel across the main flow channel joins the main flow channel are set at generally the same position in an elongating direction of the main flow channel. "Generally the same position in an elongating direction of the main flow channel" includes mutually facing sidewall portions of the main flow channel and orthogonal sidewall portions of the main flow channel in addition to completely conforming the position.

In order to further improve the stabilization of the gas concentration it is preferable that an insertion bore that is in communication with the main flow channel is formed in the main flow channel block body, a projecting pipe that projects its branch flow channel outside is arranged on the branch flow channel block body inside of which an exit portion of the branch flow channel is provided, and a distal end of the projecting pipe further projects inward from an inside surface of the main flow channel in a state wherein the main flow channel block body and the branch flow channel block body are assembled by inserting the projecting pipe into the insertion bore.

In addition, the integrated gas panel apparatus in accordance with claim 5 of the invention of comprises multiple branch flow channels in a course of which a gas control unit such as a valve or a mass flow controller is arranged so as to control the gas that flows inside the branch flow channel, a main flow channel into which the gas from each of the branch flow channels flows, and a panel body inside of which the branch flow channels and the main flow channel are formed by assembling multiple block bodies, and is characterized by that an insertion bore that is in communication with the main flow channel is formed in a main flow channel block body inside of which the main flow channel is arranged, and a projecting pipe that projects its branch flow channel outside is arranged on the branch flow channel block body inside of which an exit portion of the branch flow channel is provided, a distal end of the projecting pipe further projects inward from an inside surface of the main flow channel in a state wherein the main flow channel block body and the branch flow channel block body are assembled by inserting the projecting pipe into the insertion bore.

In accordance with this arrangement, since the projecting pipe as being an exit of the branch flow channel projects inside the main flow channel at the connecting portion between the branch flow channel and the main flow channel so as to narrow a diameter of the main flow channel, the gas inside the branch flow channel is strongly sucked down into the main flow channel due to a choke effect and the sucked gas is diffused in the main flow channel by a turbulent flow generated rearward of the projecting pipe. Then mixing of the gas flowing in the main flow channel with the gas flowing in each branch flow channel is further more promoted.

As a result, it is possible to mix the gas inside the gas panel apparatus more fully compared with a conventional apparatus. It is also possible to dramatically improve the responsiveness compared with a conventional apparatus by shortening a length of the pipe or decreasing a capacity of the gas mixer to be arranged on the downstream side of the gas panel apparatus or by omitting the gas mixer. In addition, with this arrangement, it is possible to improve the stability of the gas concentration at a time of rising.

In addition, even though the gas inside the branch flow channel is in a small amount, the gas can be sucked down into the main flow channel without fail. As a result, the gas flow is not likely to fluctuate at a time when a small amount of the gas flowing from the branch flow channel joins the gas in the main flow channel, and this also contributes to stabilization of the gas concentration.

Furthermore, since the branch flow channel can be joined with the main flow channel with an arrangement of just projecting the projecting pipe from the branch flow channel block body by a predetermined length, the structure is hardly complicated at all. In addition, since the projecting pipe is concealed inside in an assembled state, a surface configuration of the connecting portion can be compatible with a conventional one.

In order to promote mixing the gas easily, it is preferable that the distal end of the projecting pipe is set to reach near a center of the main flow channel in a cross section.

In addition, tridimensional integrated gas panel apparatus in accordance with claim 8 of the invention comprises multiple branch flow channels in a course of which a gas control unit such as a valve or a mass flow controller is arranged so as to control the gas that flows inside the branch flow channel, a single main flow channel into which the gas from each of the branch flow channels flows and joins, a branch flow channel block body in a shape of a lengthy panel whose bottom surface is set as a mounting surface and inside of which one branch flow channel is formed, and a center block body that holds the multiple branch flow channel block bodies so that each longitudinal direction of the multiple branch flow channel block bodies is in parallel mutually with holding surfaces formed on side peripheral surfaces, and is characterized by that the main flow channel is formed on the center block body and middle flow channels are formed to extend from each junction set on the main flow channel in a direction toward each of the branch flow channels of the branch flow channel block body each of which is mounted on the side peripheral surface of the center block body.

In accordance with this arrangement, since the branch flow channel block bodies that were conventionally arranged in a plane are arranged three-dimensionally, it is possible to downsize the apparatus and to shorten the length of the flow channel. As a result, the responsiveness can be improved. In addition, since the tridimensional integrated gas panel apparatus has a tridimensional structure, a degree-of-freedom in arranging each flow channel is increased. Then it is possible to improve the synchronism of the joining timing of each gas, and eventually to improve the stabilization of the gas concentration by devising the length of each flow channel and the junction.

More concretely, in order to improve the responsiveness by shortening a length of the main flow channel, it is preferable that the junction is set at one portion of the main flow channel. Especially, since the outlet port is ordinarily mounted on an end surface of the center block body, if the junction is set at, for example, an end portion of the center block body, the length of the main flow channel can be shortened, thereby improving the responsiveness as much as possible.

In order to improve the synchronism of the joining timing of each gas, it is preferable that a rotational symmetrical shape with a center on an axial line of a center block body is formed by each of the holding surfaces, and the junction is arranged on the axial line and each length of the middle flow channels is set to be equal.

In this case, if the main flow channel is arranged in the axial line, the length of the main flow channel can be shortened as much as possible.

In order to further improve the synchronism of the joining timing of each gas, a diameter of the middle flow channels or a diameter of the branch flow channels arranged on the downstream side of, especially a mass flow controller may be set in accordance with the flow of each gas (the less the flow is, the smaller the internal diameter is).

As a concrete embodiment with considering facility of manufacturing the tridimensional integrated gas panel apparatus, it is preferable that the center block body is in a regular polygonal column shape.

The tridimensional integrated gas panel apparatus that is used for a semiconductor manufacturing process can be represented as a concrete embodiment wherein the effect of this invention is especially remarkable and its usefulness is produced.

Effect of the Invention

With the invention in accordance with claim 1, since the length of the main flow channel can be shortened, it is possible to improve the responsiveness or the stabilization of the gas concentration at a time of rising. In addition, since the integrated gas panel apparatus is made to have the same shape as that of a conventional apparatus, it is possible to be easily replaced with a conventional panel body.

With the invention in accordance with claim 5, since mixing of the gas flowing in the main flow channel with the gas flowing in the branch flow channels is further more promoted, it is possible to improve the responsiveness compared with a conventional apparatus by shortening a length of the pipe or decreasing a capacity of the gas mixer to be arranged on the downstream side of the integrated gas panel apparatus or by omitting the gas mixer, and eventually to improve the stability of the gas concentration at a time of rising. Furthermore, since the branch flow channel can be joined with the main flow channel with an arrangement of just projecting the projecting pipe from the branch flow channel block body by a predetermined length, the structure is hardly complicated at all. In addition, since the projecting pipe is concealed inside in an assembled state, a surface configuration of the connecting portion can be compatible with a conventional one.

With the invention in accordance with claim 8, since the branch flow channel block bodies are arranged three-dimensionally, it is possible to downsize the apparatus and to improve a degree-of-freedom. As a result, it is also possible to improve the responsiveness and the stabilization of the gas concentration.

BEST MODES OF EMBODYING THE INVENTION

Several embodiments of the present claimed invention will be explained with reference to drawings. In each of the embodiments, each of the corresponding components are denoted by the same reference codes, however, there is also a reverse case that a different reference code is denoted to the component having the same function and a different shape.

First Embodiment 1

The first embodiment refers to FIG. 1 through FIG. 5.

Figure 1:
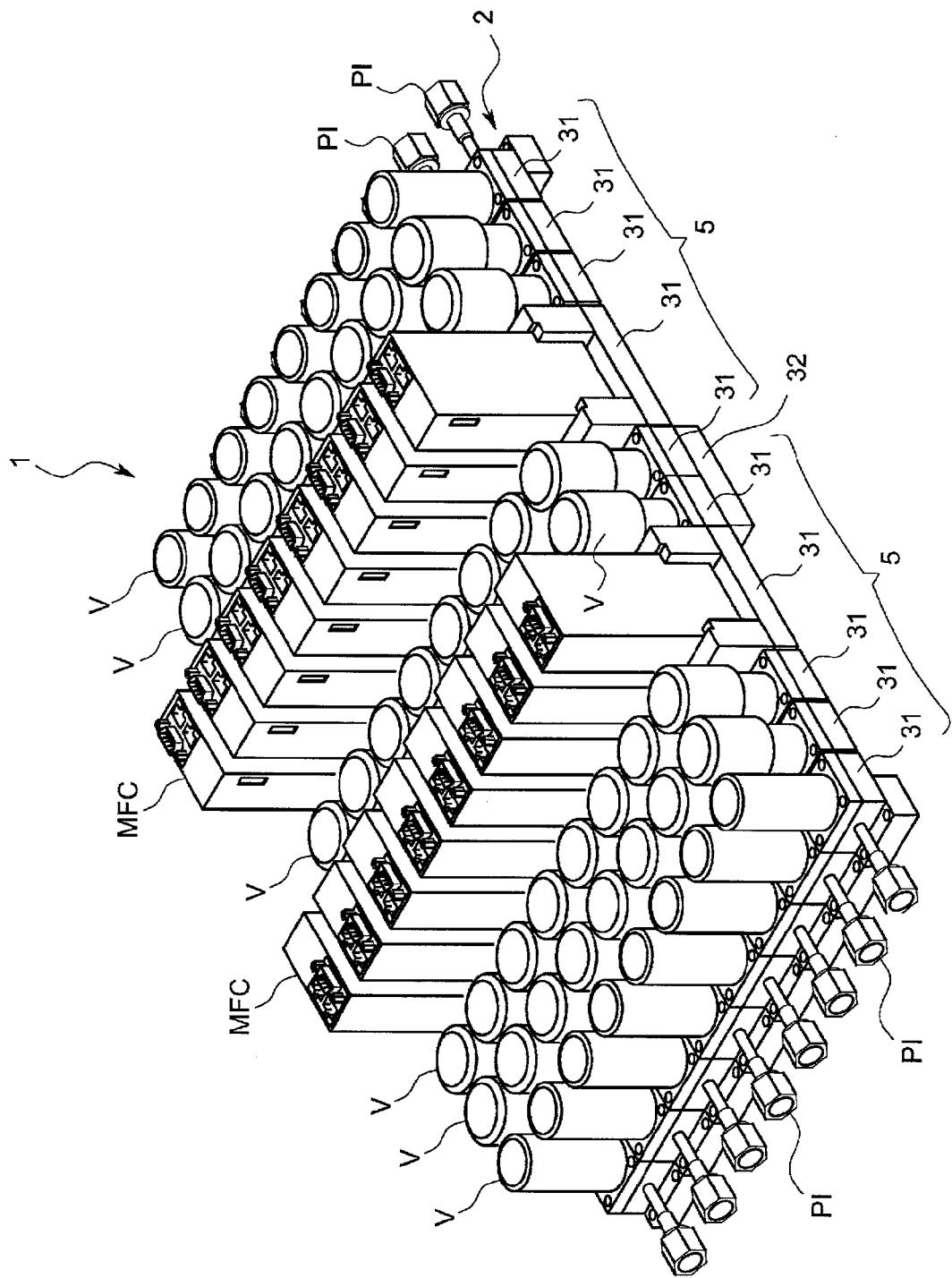
FIG. 1 is an overall perspective view of integrated gas panel apparatus in accordance with a first embodiment of the present claimed invention.

Integrated gas panel apparatus 1 in accordance with this embodiment configures a part of a semiconductor manufacturing system. As its overall view is shown in FIG. 1, the integrated gas panel apparatus 1 is to introduce various kinds of gas for film forming respectively from gas supply sources, not shown in drawings, to mix the gas and to supply the mixed gas to a chamber (not shown in drawings) for semiconductor.

First, with regard to the integrated gas panel apparatus 1, a structure of its fluid circuit including its peripheral circuitry will be explained with reference to FIG. 2.

The integrated gas panel apparatus 1 has multiple branch flow channels R1 arranged in parallel in a circuit and a single main flow channel R2 to which an exit of each branch flow channel R1 is connected.

An inlet port PI is connected to a proximal end of each branch flow channel R1 and several kinds of gas is sent to each branch flow channel R1 from the gas supply sources respectively through an outside pipe (not shown in drawings) connected to the inlet port PI. A gas control unit such as a valve V or a mass flow controller MFC is arranged in the course of each branch flow channel R1 so as to control a gas flow flowing in each branch flow channel R1 or to control a switch to purge gas respectively.

Meanwhile, as mentioned above, the main flow channel R2 has a single flow channel structure, and connecting portions CN where the above-mentioned branch flow channels R1 are connected with the main flow channel R2 are not focused in one place and are arranged at intervals along its gas flow. In this embodiment, a gas mixer MIX to stir and mix the joined gas is arranged on the downstream side of the integrated gas panel apparatus 1, namely on the downstream side of the main flow channel R2, and a flow ratio controller FRC to divide the gas mixed by the gas mixer MIX at a predetermined flow ratio and to output the divided gas to each chamber from outlet ports PO is arranged on further downstream side of the gas mixer MIX. The gas mixer MIX, the flow ratio controller FRC and the outlet ports PO are not drawn in FIG. 1.

With this arrangement, the gas supplied from each gas supply source is flow-controlled in the branch flow channel R1 of the integrated gas panel apparatus 1 and introduced into the main flow channel R2, then fully mixed by the gas mixer MIX, and output at a predetermined flow ratio through the flow ratio controller FRC from each of the outlet ports PO respectively.

Figure 2:
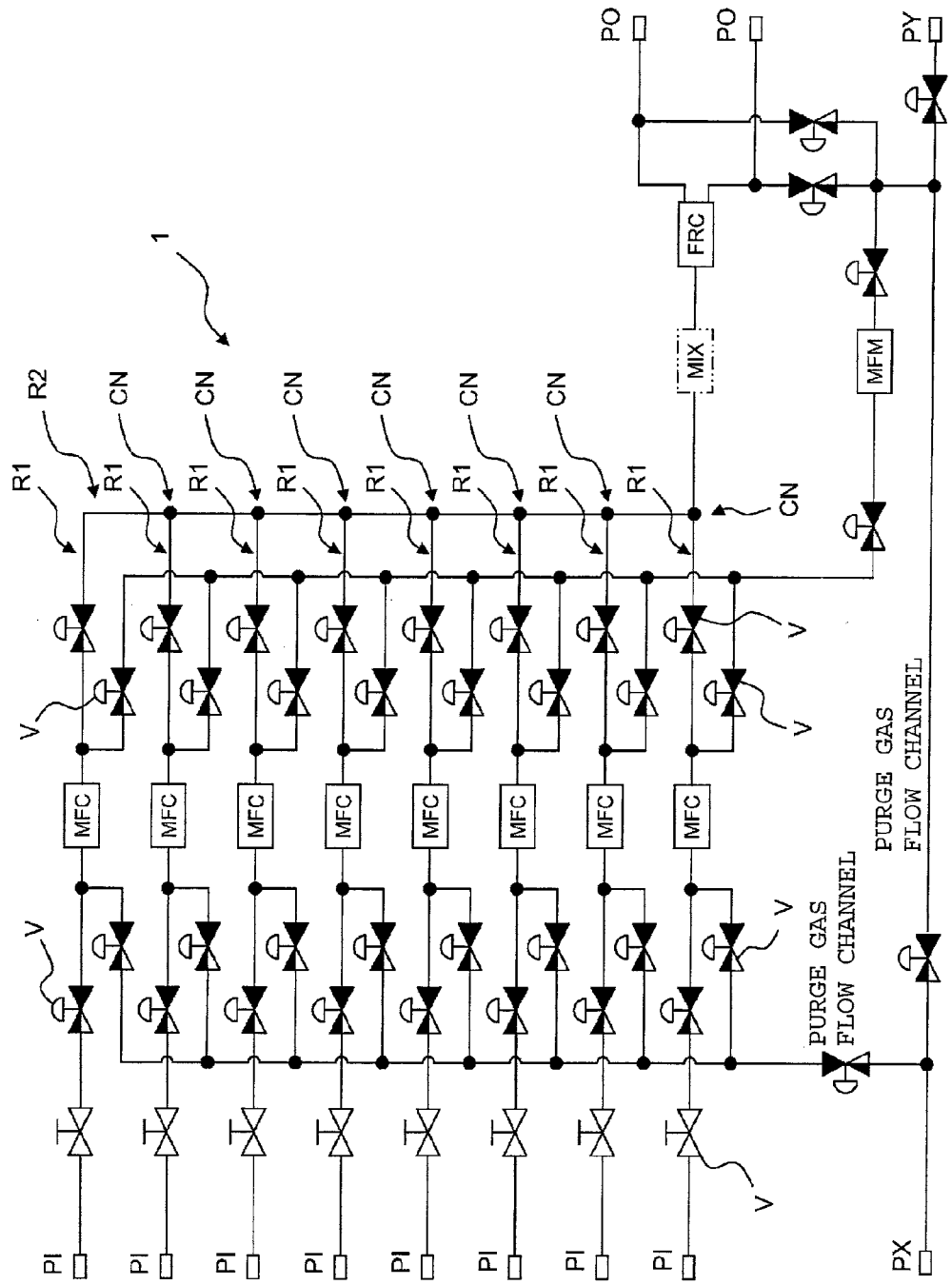
FIG. 2 is a fluid circuit diagram of the integrated gas panel apparatus of this embodiment.

In FIG. 2, the above-mentioned flow channel for the purge gas, its inlet port PX, and its outlet port PY are drawn in addition to the main flow channel R2 and the branch flow channels R1. The component denoted by the reference code MFM is a verifier to verify whether the flow shown by the mass flow controller MFC is accurate or not.

Next, a mechanical structure of the integrated gas panel apparatus 1 will be explained with reference to FIG. 1.

The integrated gas panel apparatus 1 comprises a panel body 2 in a generally plate shape inside of which the main flow channel R2 and the branch flow channels R1 are formed, the above-mentioned gas control unit V, MFC and ancillary piping structures such as inlet ports PI.

The panel body 2 is, as shown in FIG. 1, in a plate shape formed by connecting multiple block bodies in a flat. There are several kinds of block bodies. In this embodiment at least branch flow channel block bodies 31 constituting the branch flow channels R1 and a main flow channel block body 32 constituting the main flow channel R2 are used.

Each of the branch flow channel block bodies 31 is in a flat square plane shape and some of the branch block bodies 31 have different internal piping structures such as for loading a valve or for loading a mass flow controller. One branch flow channel R1 is formed by arranging multiple branch flow channel block bodies 31 serially so as to be in a shape of a long sheet, and multiple columns (hereinafter also referred to as a branch flow channel block body column 5) of thus serially arranged branch flow block bodies 31 are arranged in a horizontal row so as to be in a plate shape. Then multiple branch flow channels R1 are arranged serially as mentioned in the circuit structure.

The main flow channel block body 32 is, for example, in a shape of a single long plate, inside of which the main flow channel R2 extends along a longitudinal direction (an elongating direction). The main flow channel block body 32 is laminated and connected in a vertical direction (in a direction perpendicular to the plane surface direction of the panel body 2) of a lower surface of the branch flow channel block body 31. The elongating direction of the main flow channel block body 32 is perpendicular to the elongating direction of the branch flow channel block body column 5.

Figure 3:
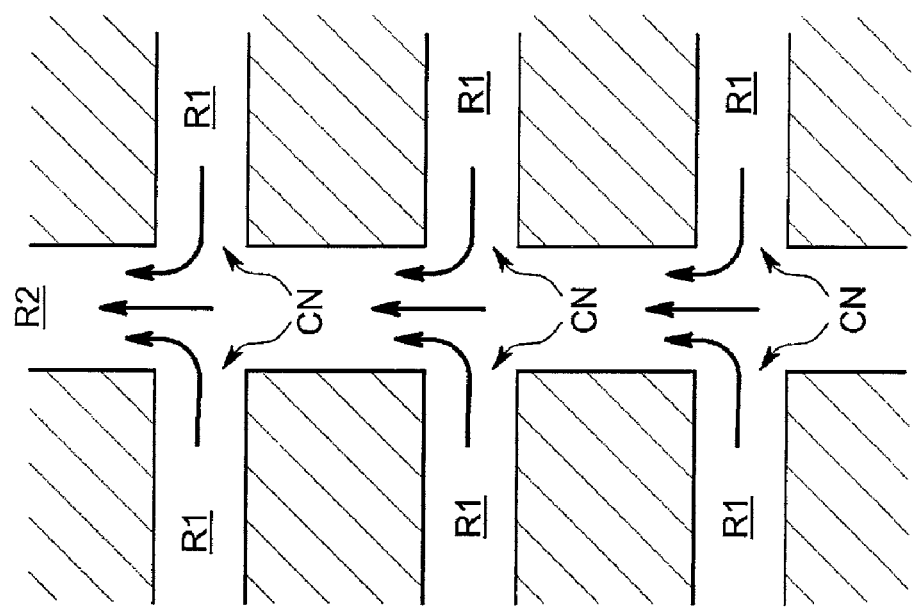
FIG. 3 is a pattern diagram showing a connecting portion in this embodiment viewed from a direction of a plane surface.

In this embodiment, multiple (for example, four for each side) branch flow channel block body columns 5 are arranged bilaterally symmetrically with the center on the main flow channel block body 32. With this arrangement, as its pattern diagram viewed from the direction of the plane surface is shown in FIG. 3, the branch flow channels R1 are arranged symmetrically at both sides of the main flow channel R2 with the center on the main flow channel R2.

In addition, the connecting portion CN (hereinafter also referred to as a junction) where one branch flow channel R1 joins the main flow channel R2 and another connecting portion CN where the other branch flow channel R1 that faces to the above-mentioned branch flow channel R1 across the main flow channel R2 joins the main flow channel R2 are set both at generally the same position in an elongating direction of the main flow channel R2 and at both side positions facing each other of the main flow channel R2. One connecting portion CN may be located at a bottom part of a main flow channel and the other connecting portion CN may be located at a side part of the main flow channel as long as each of the connecting portions CN is located at the same position in the elongating direction of the main flow channel R2 if there is a designing restriction in arranging components.

In accordance with the gas panel apparatus 1 having the above-mentioned arrangement, since the branch flow channel R1 that is conventionally arranged at only one side of the main flow channel R2 is arranged at the right and left sides of the main flow channel R2, a length of an area where each of the junctions CN are arranged in the main flow channel can be shortened by half compared with a conventional arrangement. As a result, since the time required for the gas to reach the final exit can be shortened, it is possible to improve the responsiveness and also to improve stabilization of the gas concentration at a time of rising or the like.

In addition, since the panel body 2 is made to have the same shape as that of a conventional panel body by arranging the block bodies in a plane, the panel body 2 can be easily replaced with, for example, an existing panel body.

Next, a modified embodiment of this invention will be explained (in the following modified embodiment, the components corresponding to those of the above-mentioned embodiment are denoted by the same reference codes).

Figure 4:
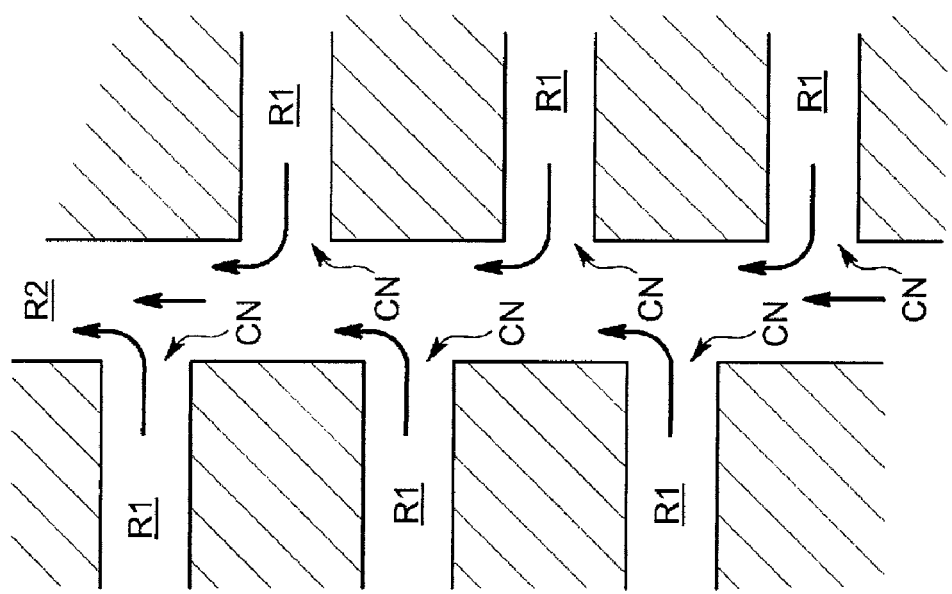
FIG. 4 is a pattern diagram showing a connecting portion of integrated gas panel apparatus of a modified embodiment of this embodiment viewed from a direction of a plane surface.

For example, as its pattern diagram is shown in FIG. 4, the right and left branch flow channels R1 may be connected to the main flow channel R2 zigzag. In accordance with this arrangement, since a junction CN where one branch flow channel joins the main flow channel and another junction CN where the other branch flow channel that faces to the above-mentioned branch flow channel across the main flow channel joins the main flow channel R2 are set at different positions in an elongating direction of the main flow channel, a length of the main flow channel R2 becomes a little longer compared with a case of the above-mentioned embodiment. However, since it is still possible to shorten a length of the main flow channel R2 dramatically compared with a case that branch flow channels are arranged at only one side of the main flow channel like a conventional arrangement so that almost the same effect and operation can be produced as that of the above-mentioned embodiment.

Furthermore, in accordance with this embodiment, exit pipes 311 of the branch flow channels R1 can be easily arranged to project at the junction CN in the main flow channel R2 by a predetermined length without causing mutual interference.

Next, one example of the arrangement of the junction CN will be detailed.

Figure 5:
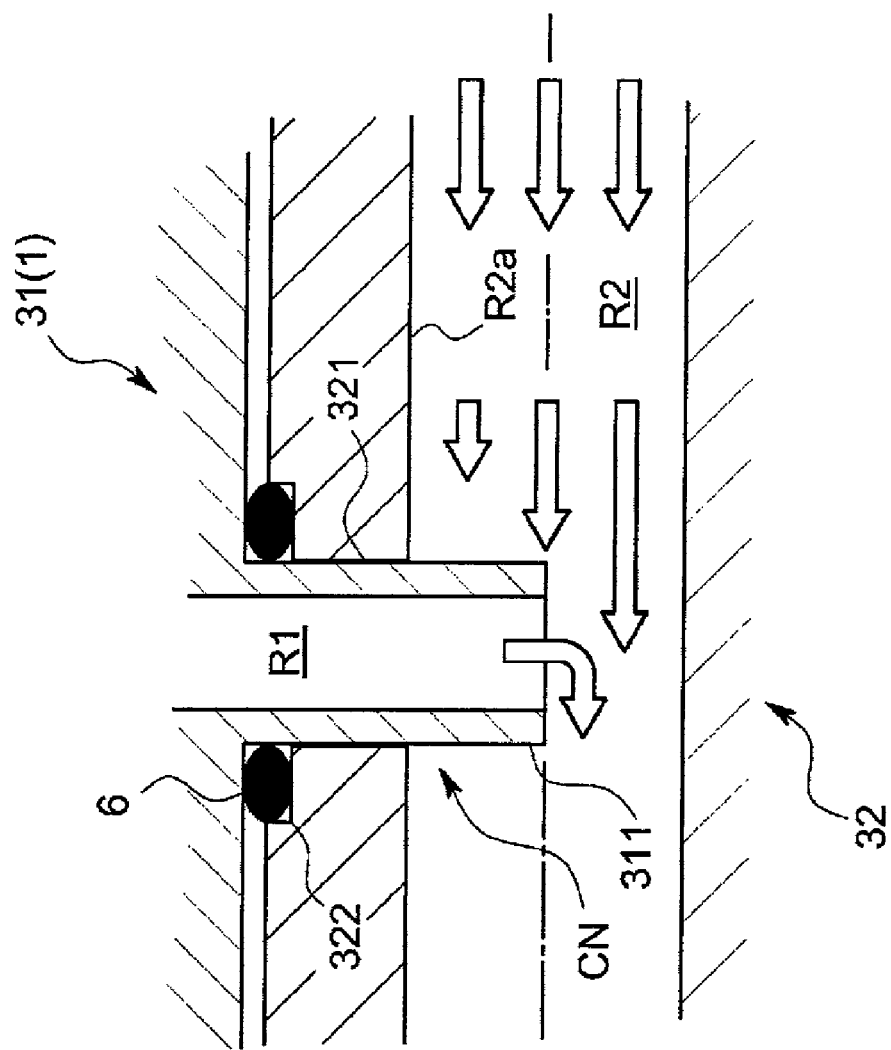
FIG. 5 is a longitudinal sectional view of a principal part showing a main flow channel of the integrated gas panel apparatus of this modified embodiment.

In this example, as shown in FIG. 5, an insertion bore 321 is arranged to open on a surface of the main flow channel block body 32, the insertion bore 321 is arranged to be in communication with the main flow channel R2 located inside of the main flow channel block body 32, and a cylindrical exit pipe (hereinafter also referred to as a projecting pipe) 311 projecting from the surface of the branch flow channel block body 31 located at the most downstream side, namely, the branch flow channel block body 31(1) having an exit part of the branch flow channel R1 is integrally (may be separately) arranged on the branch flow channel block body 31.

Then the projecting pipe 311 is inserted into the insertion bore 321 and a distal end of the projecting pipe 311 further projects inward from an inside surface R2a (shown in FIG. 5) of the main flow channel R2 in a state wherein the main flow channel block body 32 and the branch flow channel block body 31(1) are assembled. A length of the projecting part is so set that, for example, the distal end of the projecting pipe 311 reaches near a center of the main flow channel R2 in a cross section.

In addition, in this assembled state, a seal member 6 such as an O-ring is arranged between a plain surface of the main flow channel block body 32 and a plain surface of the branch flow channel block body 31(1) that faces the main flow channel block body 32 so as to tightly attach the main flow channel block body 32 and the branch flow channel block body 31(1) in a thrust direction. The seal member 6 prevents gas leakage at the connecting portion CN.

In accordance with this arrangement, since the projecting pipe 311 as being an exit of the branch flow channel R1 projects inside the main flow channel R2 at the connecting portion CN between the branch flow channel R1 and the main flow channel R2 so as to narrow a diameter of the main flow channel R2, the gas flow rate of the main flow channel R2 at the connecting portion CN quickens and the pressure drops so that the gas inside the branch flow channel R1 is strongly sucked down into the main flow channel R2. Since the sucked gas is diffused in the main flow channel R2 by a turbulent flow generated rearward of the projecting pipe 311, the gas can be mixed into the gas flowing in the main flow channel R2 further more uniformly. In other words, it is possible to mix the gas inside the panel body 2 more fully in advance compared to a conventional arrangement.

As a result, it is possible to shorten a length of the pipe located on the downstream side of the connecting portion that used to be set long for the conventional arrangement in order to fully mix the gas, and also to downsize the capacity of the gas mixer MIX or to omit the gas mixer MIX. In addition, it is possible to further improve the responsiveness of the fluid circuit system by just an amount that the flow channel capacity is downsized.

In other words, if this arrangement is applied to the above-mentioned embodiment, it is possible both to shorten the length of the main flow channel R2 where the junctions CN are arranged and to shorten the length of the flow channel located on the downstream side of the junction CN. As a result, it is possible to dramatically promote improvement of the responsiveness and the stability of the gas concentration at a time of rising due to the improved responsiveness.

In addition, even though the gas flow in the branch flow channel R1 is small, since it is possible to suck down the gas into the main flow channel R2 without fail as mentioned above, also in view of this it is possible to further improve the final stability of the mixed gas concentration.

In addition, since a point of the structure of this embodiment that is significantly different from the conventional structure is only that the branch flow channel block bodies 31 are arranged to face each other and that the projecting pipe 311 projects from the branch flow channel block body 31 by a predetermined length, the structure is hardly complicated at all. Furthermore, since the projecting pipe 311 is concealed inside in an assembled state, a surface configuration of the connecting portion can be compatible with a conventional one.

As another modified embodiment, for example, an internal diameter of each branch flow channel may be set in accordance with the flow of each gas (the less the flow is, the smaller the internal diameter is). With this arrangement, since the flow rate of each gas becomes equal and synchronism of the joining timing of each gas in the main flow channel is improved compared with the conventional arrangement, it is possible to supply the mixed gas in a shorter period of time without being affected by the gas flow.

The block body is not limited to a square shape, but may be, for example, a circular plate shape. However, it is preferable to have a flat part at a position facing each other in order to facilitate the thrust seal structure.

Second Embodiment

A second embodiment of this invention will be explained with reference to FIG. 6 through FIG. 10.

Figure 6:
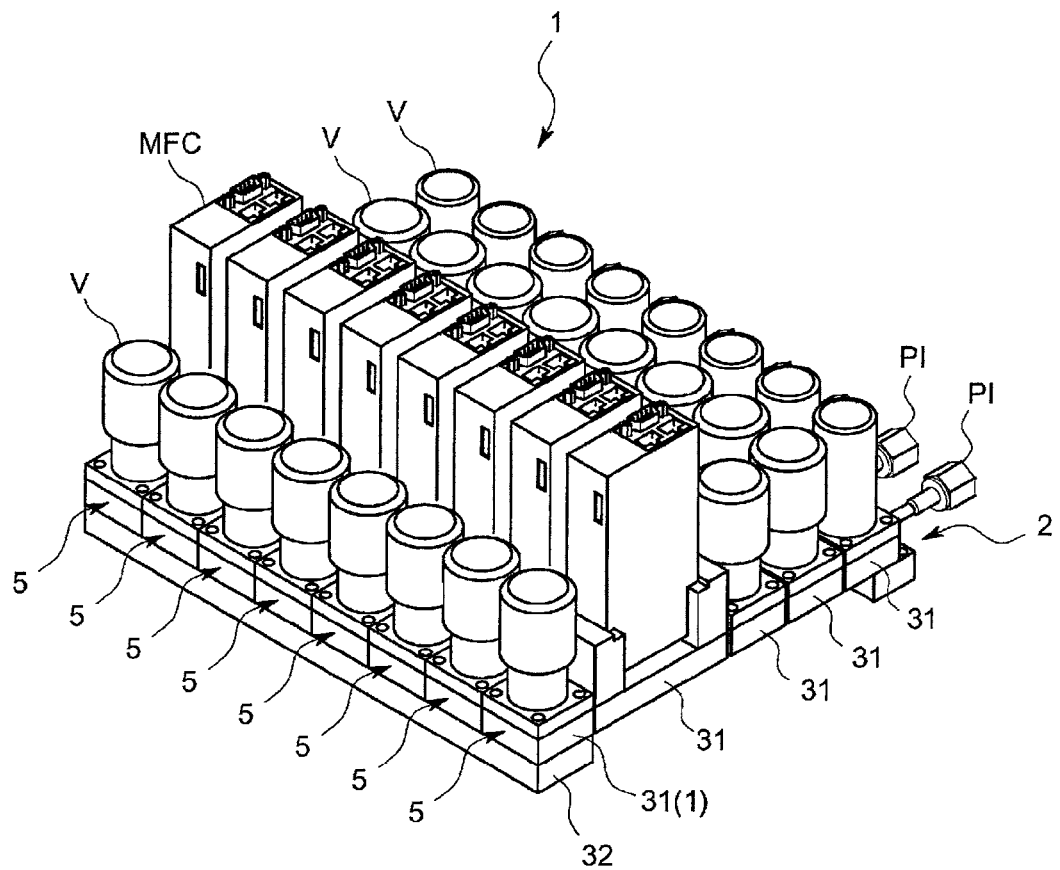
FIG. 6 is an overall perspective view of integrated gas panel apparatus in accordance with a second embodiment of the present claimed invention.

The integrated gas panel apparatus 1 in accordance with this embodiment configures a part of a semiconductor manufacturing system. As its overall view is shown in FIG. 6, the integrated gas panel apparatus 1 is to introduce various kinds of gas for film forming respectively from gas supply sources, not shown in drawings, to mix the gas and to supply the mixed gas to a chamber (not shown in drawings) for semiconductor.

First, with regard to the integrated gas panel apparatus 1, a structure of its fluid circuit including its peripheral circuitry will be explained with reference to FIG. 7.

The integrated gas panel apparatus 1 has multiple branch flow channels R1 arranged in parallel and a single main flow channel R2 to which an exit of each branch flow channel R1 is connected.

An inlet port PI is connected to a proximal end of each branch flow channel R1 and several kinds of gas are sent to each branch flow channel R1 from the gas supply sources (not shown in drawings) respectively through an outside pipe (not shown in drawings) connected to the inlet port PI. A gas control unit such as a valve V or a mass flow controller MFC is arranged in the course of each branch flow channel R1 so as to control a gas flow flowing in each branch flow channel R1 or to control a switch to purge gas respectively.

Meanwhile, as mentioned above, the main flow channel R2 has a single flow channel structure, and connecting portions CN where the above-mentioned branch flow channels R1 are connected with the main flow channel R2 are not focused in one place and are arranged at intervals along its gas flow. In this embodiment, a gas mixer MIX to stir and mix the joined gas is arranged on the downstream side of the integrated gas panel apparatus 1, namely on the downstream side of the main flow channel R2, and a flow ratio controller FRC to divide the gas mixed by the gas mixer MIX at a predetermined flow ratio and to output the divided gas to each chamber from outlet ports PO is arranged on further downstream side of the gas mixer MIX. The gas mixer MIX, the flow ratio controller FRC and the outlet ports PO are not drawn in FIG. 6.

With this arrangement, the gas supplied from each gas supply source is flow-controlled in the branch flow channel R1 of the integrated gas panel apparatus 1 and introduced into the main flow channel R2, then fully mixed by the gas mixer MIX, and output at a predetermined flow ratio through the flow ratio controller FRC from each of the outlet ports PO respectively.

Figure 7:
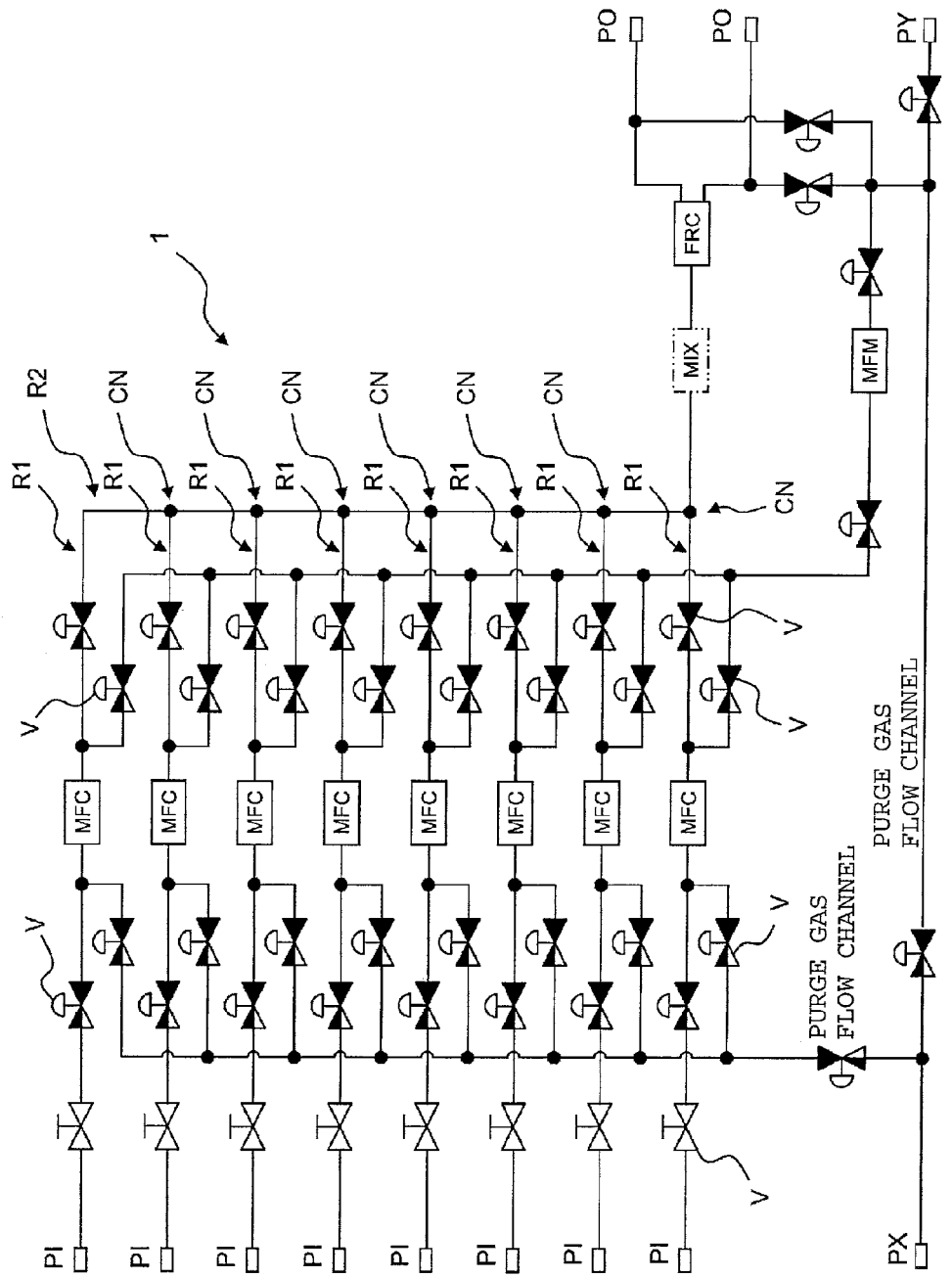
FIG. 7 is a fluid circuit diagram of the integrated gas panel apparatus of this embodiment.

In FIG. 7, the flow channel for the purge gas, its inlet port PX, and its outlet port PY are drawn in addition to the main flow channel R2 and the branch flow channels R1. The component denoted by the reference code MFM is a verifier to verify whether the flow shown by the mass flow controller MFC is accurate or not.

Next, a mechanical structure of the integrated gas panel apparatus 1 will be explained with reference to FIG. 6.

The integrated gas panel apparatus 1 comprises a panel body 2 in a generally plate shape inside of which the main flow channel R2 and the branch flow channels R1 are formed, the above-mentioned gas control unit and ancillary pipes such as inlet ports PI.

The panel body 2 is, as shown in FIG. 6, in a plate shape formed by connecting multiple block bodies in a flat. There are several kinds of the block bodies. In this embodiment at least a branch flow channel block bodies 31 constituting the branch flow channels R1 and a main flow channel block body 32 constituting the main flow channel R2 are used.

Each of the branch flow channel block bodies 31 is in a flat square plane shape and some of the branch block bodies 31 have different internal piping structures such as for loading a valve or for loading a mass flow controller. One branch flow channel R1 is formed by arranging multiple branch flow channel block bodies 31 serially so as to be in a shape of a long sheet, and multiple columns (hereinafter also referred to as a branch flow channel block body column 5) of thus serially arranged branch flow block bodies 31 are arranged in a horizontal row so as to be in a plate shape. Then multiple branch flow channels R1 are arranged serially as mentioned in the fluid circuit structure.

The main flow channel block body 32 is, for example, in a shape of a single long plate, inside of which the main flow channel R2 is arranged along its longitudinal direction. The main flow channel block body 32 is laminated and connected in a vertical direction (in a direction perpendicular to the plane surface direction of the panel body 2) of a lower surface of the branch flow channel block body 31. The elongating direction of the main flow channel block body 32 is perpendicular to the elongating direction of the branch flow channel block body column 5. With this arrangement, the exit of each branch flow channel R1 is connected to the main flow channel R2.

In this embodiment, the following arrangement is adopted to the connecting portion CN.

Figure 8:
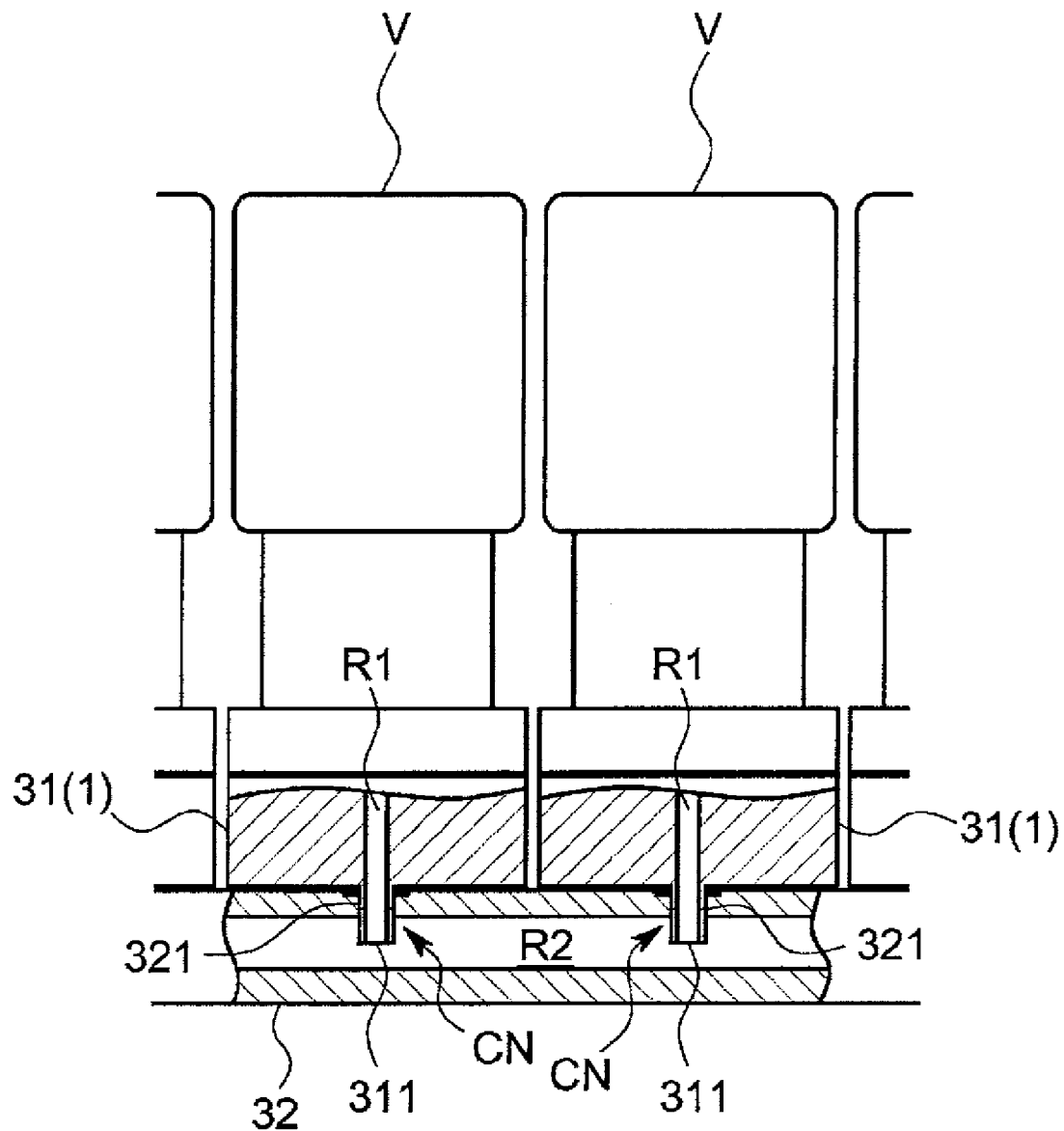
FIG. 8 is a partial sectional view of a principal part of the integrated gas panel apparatus of this embodiment.
Figure 9:
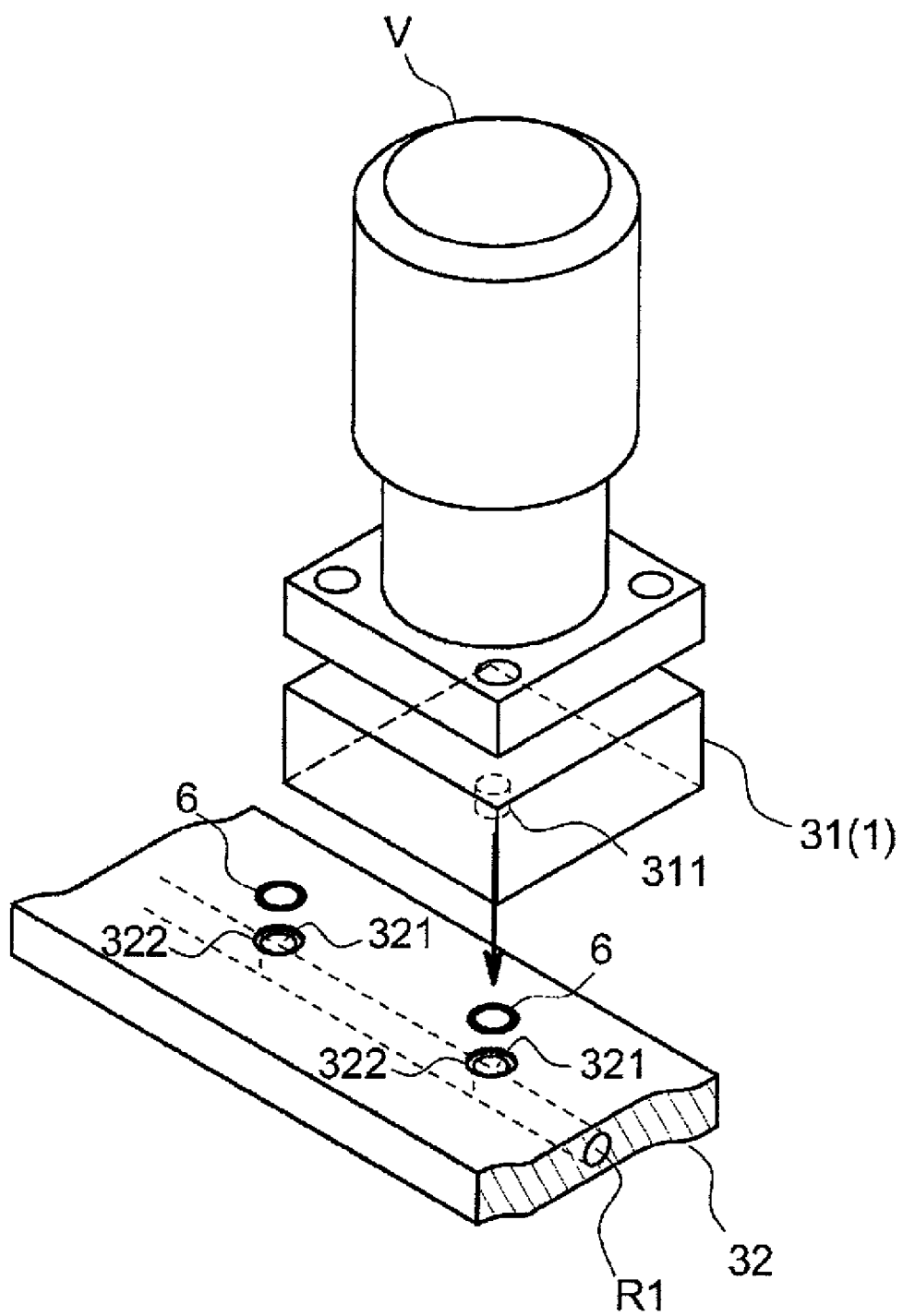
FIG. 9 is an exploded perspective view showing a connecting portion in this embodiment.
Figure 10:
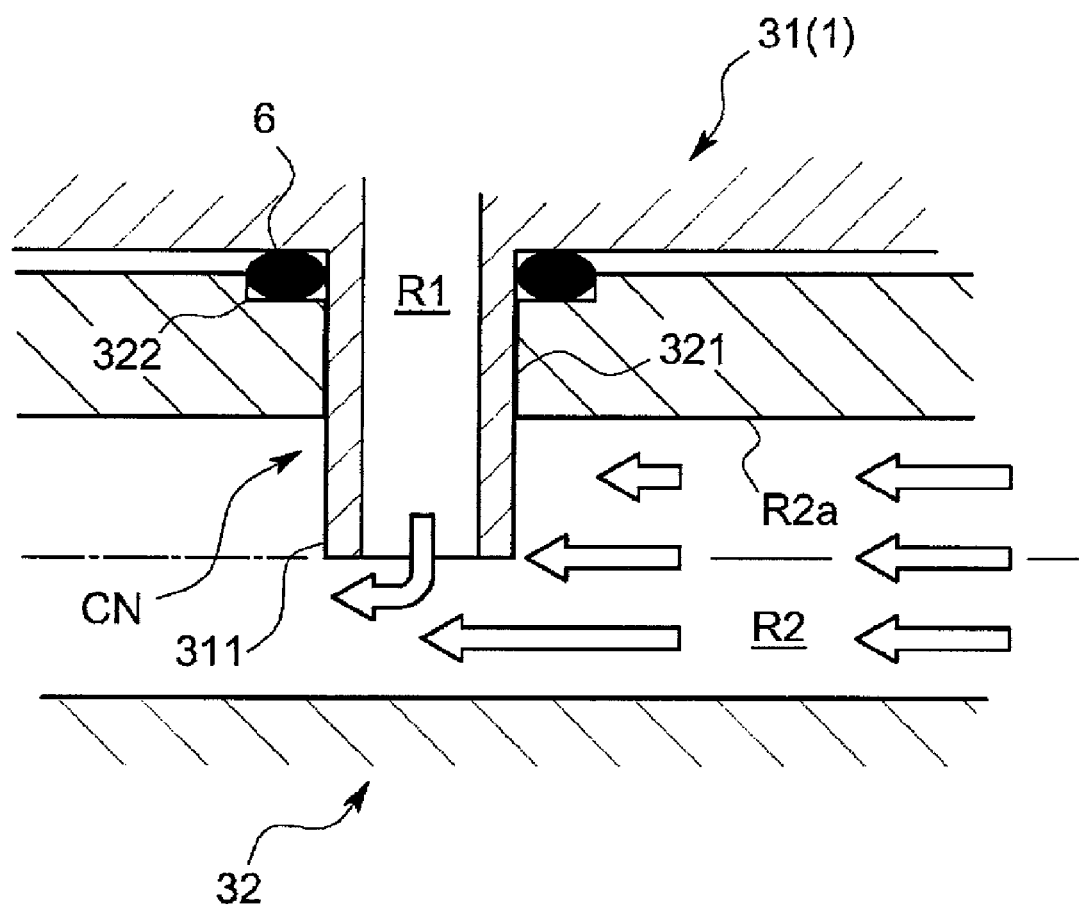
FIG. 10 is a partial sectional view of a principal part of the integrated gas panel apparatus of this embodiment.

In other words, as shown in FIG. 8 through FIG. 10, an insertion bore 321 is arranged to open on an upper surface of the main flow channel block body 32 and the insertion bore 321 is in communication with the main flow channel R2 formed inside of the main flow channel block body 32, and a cylindrical projecting pipe 311 inside of which the branch flow channel is formed to project is integrally formed with a lower surface of the branch flow channel block body 31 located on the most downstream, namely the branch flow channel 31(1) having an exit portion of the branch flow channel R1. An outside diameter of the projecting pipe 311 is set to be generally the same as an inside diameter of the insertion bore 321.

Then the projecting pipe 311 is inserted into the insertion bore 321 and a distal end of the projecting pipe 311 further projects inward from an inside surface R2a (shown in FIG. 10) of the main flow channel R2 in a state wherein the main flow channel block body 32 and the branch flow channel block body 31(1) are assembled. A length of the projecting part is so set that, for example, the distal end of the projecting pipe 311 reaches near a center of the main flow channel R2 in a cross section.

In addition, in this assembled state, a seal member 6 such as an O-ring is arranged between a plain surface of the main flow channel block body 32 and a plain surface of the branch flow channel block body 31(1) that faces the main flow channel block body 32 so as to tightly attach the main flow channel block body 32 and the branch flow channel block body 31(1) in a thrust direction. The seal member 6 prevents gas leakage at the connecting portion CN. The reference code 322 is a counter sunk part that is arranged on the main flow channel block body 32 and that accommodates the seal member 6. The counter sunk part 322 may be arranged on the branch flow channel block body 31.

In accordance with this arrangement, since the projecting pipe 311 as being an exit of the branch flow channel R1 projects inside the main flow channel R2 at the connecting portion CN between the branch flow channel R1 and the main flow channel R2 so as to narrow a diameter of the main flow channel R2, the gas flow rate of the main flow channel R2 at the connecting portion CN quickens and the pressure drops so that the gas inside the branch flow channel R1 is strongly sucked down into the main flow channel R2. Since the sucked gas is diffused in the main flow channel R2 by a turbulent flow generated rearward of the projecting pipe 311, the gas can be mixed into the gas flowing in the main flow channel R2 further more uniformly. In other words, it is possible to mix the gas inside the panel body 2 more fully in advance compared to a conventional arrangement and it is possible to downsize the capacity of the gas mixer MIX locating on the downstream side of the connecting portion CN or to omit the gas mixer MIX in some cases. As a result, it is possible to dramatically promote improvement of the responsiveness. In addition, it is also possible to improve the stability of the gas concentration at a time of rising due to the improved responsiveness.

Furthermore, even though the gas flow in the branch flow channel R1 is small, since it is possible to suck down the gas into the main flow channel R2 without fail, also in view of this it is possible to further improve the final stability of the mixed gas concentration.

In addition, since a point of the structure of this embodiment that is significantly different from the conventional structure is only that the projecting pipe 311 projects from the branch flow channel block body 31 by a predetermined length, the structure is hardly complicated at all. Furthermore, since the projecting pipe 311 is concealed inside in an assembled state, a surface configuration of the connecting portion can be compatible with a conventional one.

In addition, since a thrust seal structure wherein the seal member 6 is tightly arranged between a surface of the block body 31(1) and a surface that faces the former surface of the block body 31(1) is adopted, it is possible to easily and securely prevent the gas leakage at the connecting portion CN.

This embodiment may be modified. For example, it is acceptable at least as long as an outer diameter of the projecting pipe is smaller than an internal diameter of the main flow channel. The projecting degree of the projecting pipe in the main flow channel is preferably near a center of the main flow channel for this embodiment, however, it may be set at a degree optimal for mixing with considering the gas flow rate.

Furthermore, an internal diameter (more preferably, an internal diameter of the branch flow channel located on the downstream side of the mass flow controller) of each projecting pipe may be set in accordance with the flow of each gas (the less the flow is, the smaller the internal diameter is). With this arrangement, since it is possible to shorten the arrival time of the gas whose flowing amount is small because the flow rate of the gas of small amount can be made the same as that of the other gas, synchronism of the joining timing of each gas in the main flow channel is improved compared with the conventional arrangement, it is possible to supply the mixed gas in a shorter period of time without being affected by the gas flow.

In addition, the projecting pipe is not limited to a cylindrical shape, and may be a polygonal tube or other various shapes.

Furthermore, the projecting pipe is not only integrally arranged with the branch flow channel block body but also may be separately arranged from the branch flow channel block body and assembled together with the branch flow channel block body.

The block body is not limited to a square shape, but may be, for example, a circular plate shape. However, it is preferable to have a flat part at a position facing each other in order to facilitate the thrust seal structure.

Third Embodiment

A third embodiment of this invention will be explained with reference to FIG. 11 through FIG. 14.

Figure 11:
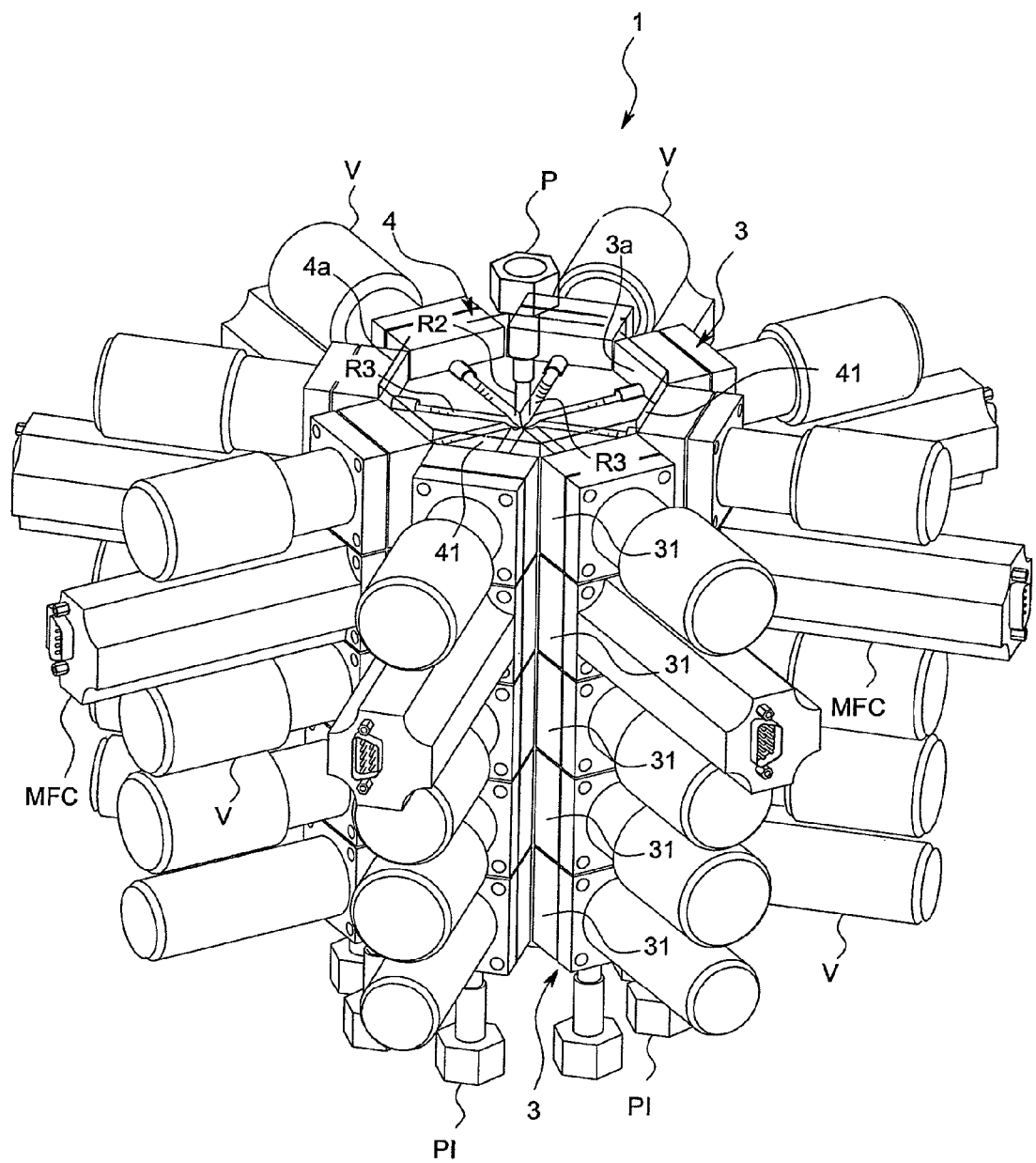
FIG. 11 is a partially broken overall perspective view showing inside of tridimensional integrated gas panel apparatus in accordance with a third embodiment of the present claimed invention.

Tridimensional integrated gas panel apparatus 1 in accordance with this embodiment configures a part of a semiconductor manufacturing system. As its overall view is shown in FIG. 11, the tridimensional integrated gas panel apparatus 1 is to introduce various kinds of gas for film forming respectively from gas supply sources, not shown in drawings, to mix the gas and to supply the mixed gas to a chamber (not shown in drawings) for semiconductor.

First, with regard to the tridimensional integrated gas panel apparatus 1, a structure of its fluid circuit including its peripheral circuitry will be explained with reference to FIG. 12.

The tridimensional integrated gas panel apparatus 1 has multiple branch flow channels R1 arranged in parallel in a circuit, a single main flow channel R2 to which an exit of each branch flow channel R1 is connected and multiple middle flow channels R3 each of which makes each of the branch flow channels R1 communicate with the main flow channel R2.

An inlet port PI is connected to a proximal end of each branch flow channel R1 and several kinds of gas are sent to each branch flow channel R1 from the gas supply sources respectively through an outside pipe (not shown in drawings) connected to the inlet port PI. A gas control unit such as a valve V or a mass flow controller MFC is arranged in the course of each branch flow channel R1 so as to control the gas flow flowing in each branch flow channel R1 or to control a switch to purge gas.

Each of the middle flow channels R3 is connected to a distal end (exit) of each branch flow channel R1 so as to make each of the branch flow channels R1 communicate with the main flow channel R2.

The main flow channel R2 has, as mentioned above, single flow channel structure. In this embodiment, a gas mixer MIX to stir and mix the joined gas is arranged on the downstream side of the tridimensional integrated gas panel apparatus 1, namely on the downstream side of the main flow channel R2, and a flow ratio controller FRC to divide the gas mixed by the gas mixer MIX at a predetermined flow ratio and to output the divided gas to each chamber from an outlet port PO is arranged on further downstream side of the gas mixer MIX. The gas mixer MIX, the flow ratio controller FRC and the outlet ports PO are not drawn in FIG. 11.

With this arrangement, the gas supplied from each gas supply source is flow-controlled in the branch flow channel R1 of the tridimensional integrated gas panel apparatus 1 and introduced into the main flow channel R2 through the middle flow channels R3, then fully mixed by the gas mixer MIX, and output at a predetermined flow ratio through the flow ratio controller FRC from each of the outlet ports PO respectively.

Figure 12:
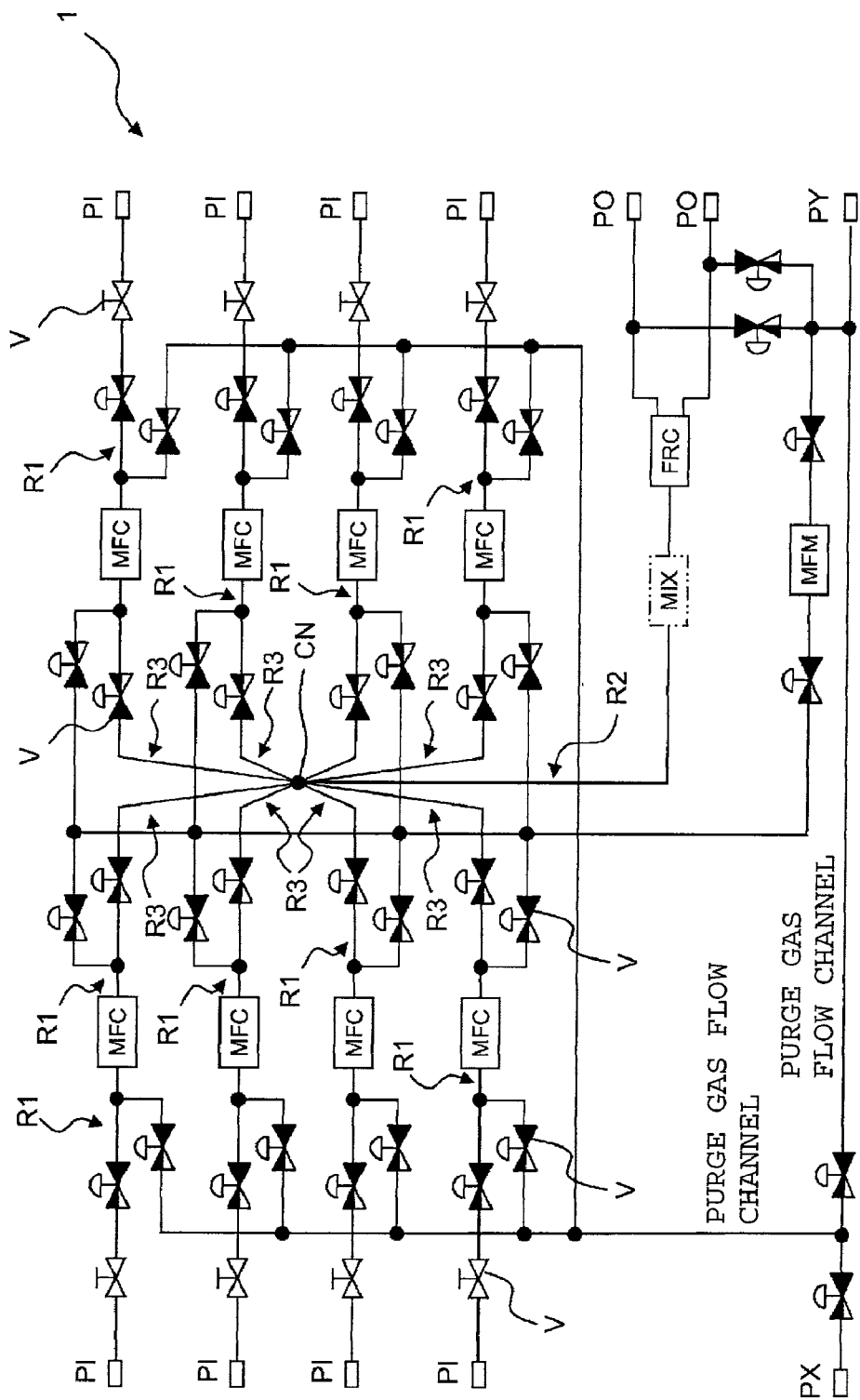
FIG. 12 is a fluid circuit diagram of the tridimensional integrated gas panel apparatus in this embodiment.

In FIG. 12, the above-mentioned flow channel for the purge gas, its inlet port PX, and its outlet port PY are drawn in addition to the main flow channel R2 and the branch flow channels R1. The component denoted by the reference code MFM is a verifier to verify whether the flow shown by the mass flow controller MFC is accurate or not.

Figure 13:
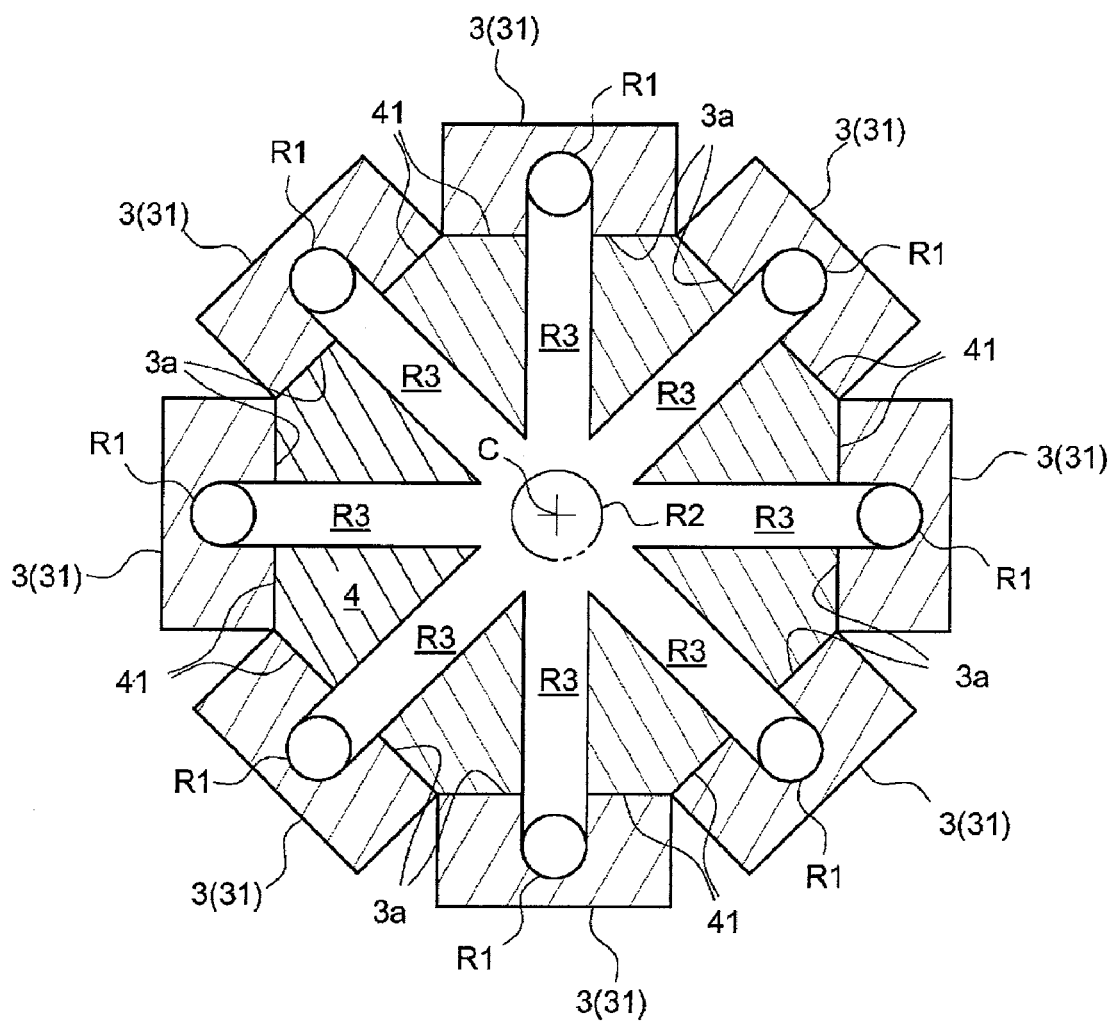
FIG. 13 is a pattern cross-sectional view showing a junction in this embodiment.
Figure 14:
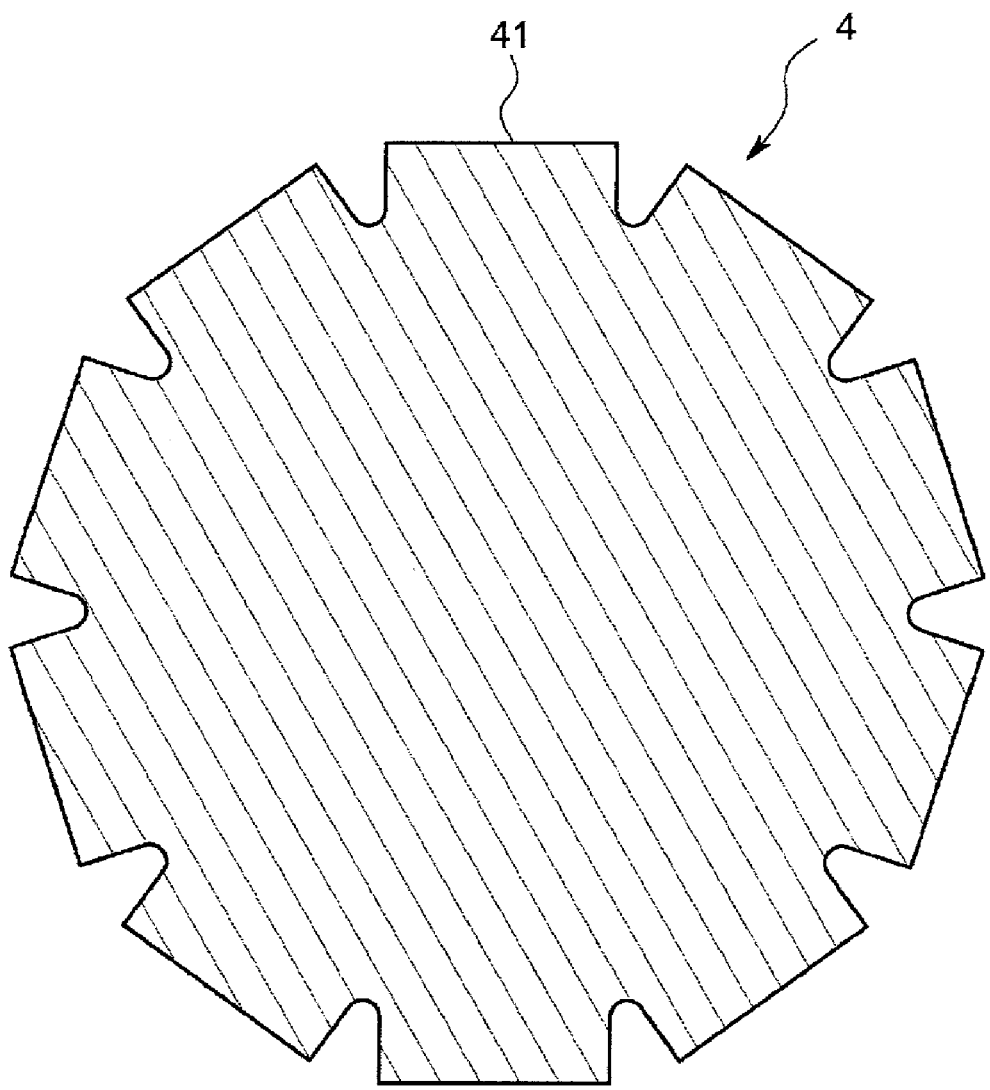
FIG. 14 is a pattern cross-sectional view of a center block body in accordance with a modified form of this embodiment.

Next, a mechanical structure of the tridimensional integrated gas panel apparatus 1 will be explained with reference to FIG. 11 and FIG. 13.

The tridimensional integrated gas panel apparatus 1 comprises branch flow channel block bodies 3 each of which is in an elongating plate panel shape inside of which one branch flow channel R1 is formed, a center block body 4 in a regular polygonal column shape (regular octagonal column shape) where the main flow channel R2 and the middle flow channels R3 are formed, the above-mentioned gas control unit V, MFC that is mounted on the branch flow channel block body 3 and ancillary pipes such as inlet ports PI. One branch flow channel R1 here represents one of the multiple branch flow channels.

The branch flow channel block body 3 comprises multiple block body elements 31 each of which is in a flat square plate shape and each of which is serially arranged. Some of the block body elements 31 have different internal piping structures such as for loading a valve or for loading a mass flow controller. It is a matter of course that the branch flow channel block body may be an integrated body.

The center block body 4 is, as mentioned above, in a regular polygonal column shape as being a rotational symmetrical shape with a center on an axial line, and each bottom surface 3a as being a mounting surface of each branch flow channel block body 3 is held to face each side peripheral surface 41 as being a mounting surface of the center block body 4.

The main flow channel R2 is arranged at one end portion of the center block body 4 along an axial line C. An outlet port P to be connected with an outside pipe is mounted on a distal end (an end at the above-mentioned end portion side) of the main flow channel R2, and the outlet port P projects from an end surface 4a of the center block body 4. In addition, a junction CN is set at a proximal end (an end located at an opposite side to the above-mentioned end portion) of the main flow channel R2, and each of the middle flow channels R3 extends from the junction CN both perpendicular to the axial line C and radially toward each side peripheral surface 41 of the center block body 4. Each of the middle flow channels R3 has the same length.

In accordance with this arrangement, since a flow channel length (a length of the middle flow channel R3) from each branch flow channel R1 to the main flow channel R2 is equal and all of the middle flow channels R3 join at the junction CN arranged at one position of the main flow channel R2, a distance from each of the branch flow channels R1 to the final outlet port P becomes equal. As a result of this, it is possible to dramatically improve the synchronism of the arrival time of each gas.

In addition, since the main flow channel R2 located at the end portion of the center block body 4 is near the outlet port P and the length of the main flow channel R2 is very short, the responsiveness becomes extremely superior. This can be said to be an effect produced by making use of the tridimensional structure characteristics.

Furthermore, since various components that were conventionally arranged in a plane are arranged three-dimensionally in this embodiment, it is possible to downsize the apparatus.

It is a matter of course that this embodiment can be modified.

For example, in order to further improve synchronism, a diameter of the middle flow channel or a diameter of each branch flow channel located on the downstream side of the mass flow controller may be set to be different in accordance with the flow of each gas (the less the flow is, the smaller the diameter is). In addition, it is possible to set a length of the middle flow channel in accordance with the flow of each gas (the less the flow is, the shorter the length is.) In this case, for example, the junction may be displaced from the axial line of the middle block body with a shape of the middle block body left to be in a rotational symmetry shape, or the length of the middle flow channel is varied by making the middle block body in a deformed shape.

Furthermore, speaking of the center block body, it is not limited to a single body, and may be arranged by combining multiple block body elements. In addition, the shape of the center block body is not limited to a regular polygonal column and may be any shape as long as a polygonal rotational symmetrical shape having the axial line as the center is formed by each holding surface 41. The center block may be in a shape shown in, for example, FIG. 14.

In addition, in consideration of manufacturing convenience or on the ground of limitation of the shape, the junction is set not at one portion but may be set at multiple positions each of which is slightly deviated on the main flow channel as long as the effect of the responsiveness is substantially negligible.

In addition, a part or all of the above-mentioned embodiments may be appropriately combined, and the present claimed invention may be variously modified without departing from a spirit of the invention.

The invention claimed is:

1. An integrated gas panel apparatus comprising multiple branch flow channels in a course of which a gas control unit such as a valve or a mass flow controller is arranged so as to control gas that flows inside the branch flow channels, a single main flow channel into which the gas from each of the branch flow channels flows and joins, and a panel body of a manifold type inside of which the branch flow channels and the main flow channel are formed by assembling multiple block bodies, wherein
the panel body comprises a main flow channel block body that forms the main flow channel, and branch flow channel block bodies that are arranged to face each other by having the main flow channel block body at the center and that forms the branch flow channels.

2. The integrated gas panel apparatus described in claim 1, wherein
a first junction where a first branch flow channel joins the main flow channel and a second junction where a second branch flow channel that faces the above-mentioned first branch flow channel across the main flow channel joins the main flow channel, are set at generally the same position in an elongating direction of the main flow channel.

3. The integrated gas panel apparatus described in claim 2, wherein
an exit pipe of the first branch flow channel is arranged to project inward from an inside surface of the main flow channel by a predetermined length at the above-mentioned first junction.

4. The integrated gas panel apparatus described in claim 1, wherein
the gas is used for a semiconductor manufacturing process.

5. An integrated gas panel apparatus comprising multiple branch flow channels in a course of which a gas control unit such as a valve or a mass flow controller is arranged so as to control gas that flows inside the branch flow channels, a main flow channel into which the gas from each of the branch flow channels flows, and a panel body inside of which the branch flow channels and the main flow channel are formed by assembling multiple block bodies, wherein
an insertion bore that is in communication with the main flow channel is formed in a main flow channel block body inside of which the main flow channel is arranged, and a projecting pipe that projects an associated branch flow channel outside is arranged on a branch flow channel block body inside of which an exit portion of the associated branch flow channel is provided,
a distal end of the projecting pipe further projects inward from an inside surface of the main flow channel in a state wherein the main flow channel block body and the branch flow channel block body are assembled by inserting the projecting pipe into the insertion bore.

6. The integrated gas panel apparatus described in claim 5, wherein
the distal end of the projecting pipe is set to reach near a center of the main flow channel in a cross section.

7. The integrated gas panel apparatus described in claim 5, wherein
the gas is used for a semiconductor manufacturing process.

* * * * *